(12) United States Patent
Wheeland et al.

(10) Patent No.: US 9,071,284 B2
(45) Date of Patent: Jun. 30, 2015

(54) LOAD IMPEDANCE DETECTION FOR STATIC OR DYNAMIC ADJUSTMENT OF PASSIVE LOADS

(71) Applicant: QUALCOMM Incorporated, San Diego, CA (US)

(72) Inventors: Cody B. Wheeland, San Diego, CA (US); Ryan Tseng, San Diego, CA (US); William H Von Novak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 239 days.

(21) Appl. No.: 13/646,553

(22) Filed: Oct. 5, 2012

(65) Prior Publication Data
US 2013/0099807 A1    Apr. 25, 2013

Related U.S. Application Data

(60) Provisional application No. 61/550,251, filed on Oct. 21, 2011, provisional application No. 61/550,182, filed on Oct. 21, 2011.

(51) Int. Cl.
*G01R 27/02* (2006.01)
*H02J 17/00* (2006.01)
*H04B 5/00* (2006.01)

(52) U.S. Cl.
CPC .............. *H04B 5/0037* (2013.01); *H02J 17/00* (2013.01)

(58) Field of Classification Search
CPC ................................ H04B 5/0037; H02J 17/00
See application file for complete search history.

(56) References Cited

U.S. PATENT DOCUMENTS

| | | | |
|---|---|---|---|
| 6,844,755 | B2 | 1/2005 | Ajit |
| 7,276,857 | B2 | 10/2007 | Logsdon et al. |
| 8,934,857 | B2 * | 1/2015 | Low et al. ................... 307/104 |
| 2010/0151808 | A1 * | 6/2010 | Toncich et al. ............ 455/226.3 |
| 2011/0193417 | A1 | 8/2011 | Hirasaka et al. |
| 2011/0234011 | A1 | 9/2011 | Yi et al. |
| 2011/0241437 | A1 | 10/2011 | Kanno |
| 2011/0248571 | A1 | 10/2011 | Kim et al. |
| 2011/0266882 | A1 | 11/2011 | Yamamoto et al. |
| 2012/0038220 | A1 | 2/2012 | Kim et al. |
| 2012/0049640 | A1 | 3/2012 | Ichikawa et al. |
| 2012/0049642 | A1 | 3/2012 | Kim et al. |
| 2012/0161538 | A1 | 6/2012 | Kinoshita et al. |
| 2012/0223589 | A1 * | 9/2012 | Low et al. ................... 307/104 |
| 2012/0267960 | A1 * | 10/2012 | Low et al. ................... 307/104 |
| 2014/0062213 | A1 * | 3/2014 | Wheatley et al. ........... 307/104 |
| 2014/0240057 | A1 * | 8/2014 | Low et al. .................... 333/32 |

FOREIGN PATENT DOCUMENTS

WO    WO2009149464 A2    12/2009

OTHER PUBLICATIONS

International Search Report and Written Opinion—PCT/US2012/060590—ISA/EPO—Apr. 15, 2013.

* cited by examiner

*Primary Examiner* — Jermele M Hollington
(74) *Attorney, Agent, or Firm* — Knobbe Martens Olson & Bear LLP

(57) ABSTRACT

This disclosure provides systems, methods and apparatus for detecting an impedance of a wireless power transmitter load. In one aspect, a method of determining a reactive condition of a wireless power transmitter apparatus is provided. The method comprises determining a value correlated to a voltage of a drain of a switching element of a driver circuit of the wireless power transmitter. The method further comprises determining a reactance load change based on the determined voltage.

64 Claims, 9 Drawing Sheets

LOAD IMPEDANCE DETECTION FOR STATIC OR DYNAMIC ADJUSTMENT OF PASSIVE LOADS

CROSS-REFERENCE TO RELATED APPLICATIONS

The disclosure claims priority to U.S. Provisional Patent Application No. 61/550,182, filed Oct. 21, 2011, entitled "LOAD SWITCHING TOPOLOGY FOR STATIC OR DYNAMIC ADJUSTMENT OF PASSIVE LOAD," and assigned to the assignee hereof, and to U.S. Provisional Patent Application No. 61/550,251, filed Oct. 21, 2011, entitled "LOAD IMPEDANCE DETECTION FOR STATIC OR DYNAMIC ADJUSTMENT OF PASSIVE LOADS," and assigned to the assignee hereof. The disclosures of both prior applications are considered part of, and are incorporated by reference in, this disclosure.

FIELD

The present invention relates generally to wireless power. More specifically, the disclosure is directed to detecting the load impedance of a wireless power transmitter.

BACKGROUND

An increasing number and variety of electronic devices are powered via rechargeable batteries. Such devices include mobile phones, portable music players, laptop computers, tablet computers, computer peripheral devices, communication devices (e.g., Bluetooth devices), digital cameras, hearing aids, and the like. While battery technology has improved, battery-powered electronic devices increasingly require and consume greater amounts of power. As such, these devices constantly require recharging. Rechargeable devices are often charged via wired connections through cables or other similar connectors that are physically connected to a power supply. Cables and similar connectors may sometimes be inconvenient or cumbersome and have other drawbacks. Wireless charging systems that are capable of transferring power in free space to be used to charge rechargeable electronic devices or provide power to electronic devices may overcome some of the deficiencies of wired charging solutions. As such, wireless power transfer systems and methods that efficiently and safely transfer power to electronic devices are desirable.

SUMMARY OF THE INVENTION

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a method of operating a wireless power transmitter apparatus. The method includes determining a characteristic correlated to a voltage of a terminal of a switching element of a driver circuit of the wireless power transmitter. The method further includes determining a reactance of a load based on the determined characteristic.

Another aspect of the disclosure provides an apparatus for wireless power transmission. The apparatus includes means for determining a characteristic correlated to a voltage of a terminal of a switching element of a driver circuit of the wireless power transmitter. The apparatus further includes means for determining a reactance of a load based on the determined characteristic.

Another aspect of the disclosure provides a non-transitory computer-readable medium. The medium includes code that, when executed, causes an apparatus to determine a characteristic correlated to a voltage of a terminal of a switching element of a driver circuit of a wireless power transmitter. The medium further includes code that, when executed, causes the apparatus to determine a reactance of a load based on the determined characteristic.

Another aspect of the disclosure provides an apparatus configured to determine a reactive condition of a wireless power transmitter apparatus. The apparatus comprises a drain voltage input, a threshold voltage input, a gate drive voltage input, an output. The apparatus further comprises a comparator configured to compare the drain voltage input and the threshold voltage input. The comparator is further configured to output a digital signal indicative of whether the drain voltage input is greater than the threshold voltage input. The apparatus further comprises a flip-flop configured to receive the digital signal at a data input. The flip-flop is further configured to receive the gate drive voltage input at a clock input. The flip-flop is further configured to sample the digital signal on a rising or falling edge of the synchronized gate drive signal. The flip-flop is further configured to output an inverted or non-inverted version of the sampled voltage at the output.

Figure 1:
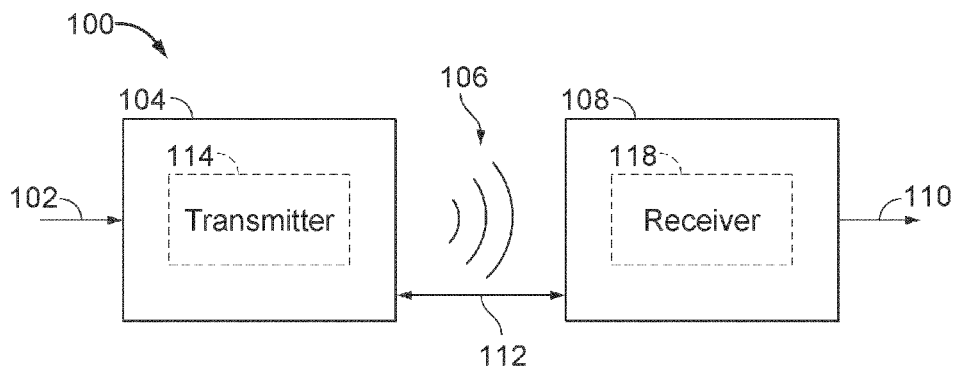
FIG. 1 is a functional block diagram of an exemplary wireless power transfer system, in accordance with exemplary embodiments of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. The exemplary embodiments of the invention may be practiced without these specific details. In some instances, well-known structures and devices are shown in block diagram form in order to avoid obscuring the novelty of the exemplary embodiments presented herein.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

FIG. 1 is a functional block diagram of an exemplary wireless power transfer system 100, in accordance with exemplary embodiments of the invention. Input power 102 may be provided to a transmitter 104 from a power source (not shown) for generating a field 106 for providing energy transfer. A receiver 108 may couple to the field 106 and generate output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship. When the resonant frequency of receiver 108 and the resonant frequency of transmitter 104 are substantially the same or very close, transmission losses between the transmitter 104 and the receiver 108 are minimal. As such, wireless power transfer may be provided over larger distance in contrast to purely inductive solutions that may require large coils that require coils to be very close (e.g., mms). Resonant inductive coupling techniques may thus allow for improved efficiency and power transfer over various distances and with a variety of inductive coil configurations.

The receiver 108 may receive power when the receiver 108 is located in an energy field 106 produced by the transmitter 104. The field 106 corresponds to a region where energy output by the transmitter 104 may be captured by a receiver 106. In some cases, the field 106 may correspond to the "near-field" of the transmitter 104 as will be further described below. The transmitter 104 may include a transmit coil 114 for outputting an energy transmission. The receiver 108 further includes a receive coil 118 for receiving or capturing energy from the energy transmission. The near-field may correspond to a region in which there are strong reactive fields resulting from the currents and charges in the transmit coil 114 that do not radiate power away from the transmit coil 114. In some cases the near-field may correspond to a region that is within about one wavelength (or a fraction thereof) of the transmit coil 114. The transmit and receive coils 114 and 118 are sized according to applications and devices to be associated therewith. As described above, efficient energy transfer may occur by coupling a large portion of the energy in a field 106 of the transmit coil 114 to a receive coil 118 rather than propagating most of the energy in an electromagnetic wave to the far field. When positioned within the field 106, a "coupling mode" may be developed between the transmit coil 114 and the receive coil 118. The area around the transmit and receive coils 114 and 118 where this coupling may occur is referred to herein as a coupling-mode region.

Figure 2:
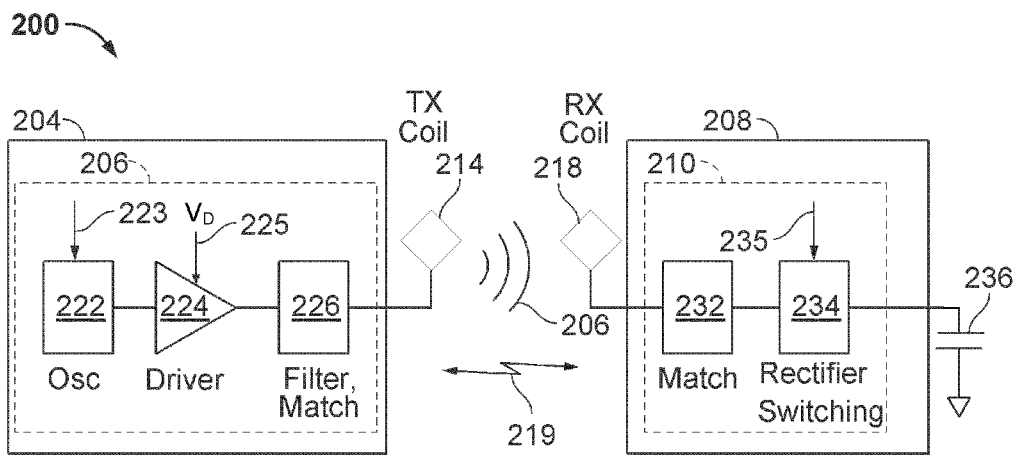
FIG. 2 is a functional block diagram of exemplary components that may be used in the wireless power transfer system of FIG. 1, in accordance with various exemplary embodiments of the invention.

FIG. 2 is a functional block diagram of exemplary components that may be used in the wireless power transfer system 100 of FIG. 1, in accordance with various exemplary embodiments of the invention. The transmitter 204 may include transmit circuitry 206 that may include an oscillator 222, a driver circuit 224, and a filter and matching circuit 226. The oscillator 222 may be configured to generate a signal at a desired frequency, such as 468.75 KHz, 6.78 MHz or 13.56 MHz, that may be adjusted in response to a frequency control signal 223. The oscillator signal may be provided to a driver circuit 224 configured to drive the transmit coil 214 at, for example, a resonant frequency of the transmit coil 214. The driver circuit 224 may be a switching amplifier configured to receive a square wave from the oscillator 22 and output a sine wave. For example, the driver circuit 224 may be a class E amplifier. A filter and matching circuit 226 may be also included to filter out harmonics or other unwanted frequencies and match the impedance of the transmitter 204 to the transmit coil 214.

The receiver 108 may include receive circuitry 210 that may include a matching circuit 232 and a rectifier and switching circuit 234 to generate a DC power output from an AC power input to charge a battery 236 as shown in FIG. 2 or to power a device (not shown) coupled to the receiver 108. The matching circuit 232 may be included to match the impedance of the receive circuitry 210 to the receive coil 218. The receiver 208 and transmitter 204 may additionally communicate on a separate communication channel 219 (e.g., Bluetooth, zigbee, cellular, etc). The receiver 208 and transmitter 204 may alternatively communicate via in-band signaling using characteristics of the wireless field 206.

As described more fully below, receiver 208, that may initially have a selectively disablable associated load (e.g., battery 236), may be configured to determine whether an amount of power transmitted by transmitter 204 and received by receiver 208 is appropriate for charging a battery 236. Further, receiver 208 may be configured to enable a load (e.g., battery 236) upon determining that the amount of power is appropriate. In some embodiments, a receiver 208 may be configured to directly utilize power received from a wireless power transfer field without charging of a battery 236. For example, a communication device, such as a near-field communication (NFC) or radio-frequency identification device (RFID may be configured to receive power from a wireless power transfer field and communicate by interacting with the wireless power transfer field and/or utilize the received power to communicate with a transmitter 204 or other devices.

Figure 3:
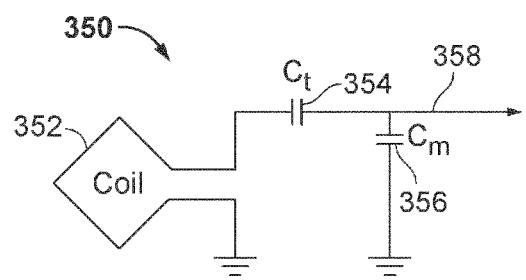
FIG. 3 is a schematic diagram of a portion of transmit circuitry or receive circuitry of FIG. 2 including a transmit or receive coil, in accordance with exemplary embodiments of the invention.

FIG. 3 is a schematic diagram of a portion of transmit circuitry or receive circuitry of FIG. 2 including a transmit or receive coil 352, in accordance with exemplary embodiments of the invention. As illustrated in FIG. 3, transmit circuitry 350 used in exemplary embodiments may include a coil 352. The coil may also be referred to or be configured as a "loop" antenna 352. The coil 352 may also be referred to herein or configured as a "magnetic" antenna or an induction coil. The term "coil" is intended to refer to a component that may wirelessly output or receive energy for coupling to another "coil." The coil may also be referred to as an "antenna" of a type that is configured to wirelessly output or receive power. The coil 352 may be configured to include an air core or a physical core such as a ferrite core (not shown). Air core loop coils may be more tolerable to extraneous physical devices placed in the vicinity of the core. Furthermore, an air core loop coil 352 allows the placement of other components within the core area. In addition, an air core loop may more readily enable placement of the receive coil 218 (FIG. 2) within a plane of the transmit coil 214 (FIG. 2) where the coupled-mode region of the transmit coil 214 (FIG. 2) may be more powerful.

As stated, efficient transfer of energy between the transmitter 104 and receiver 108 may occur during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the field 106 of the transmitting coil to the receiving coil residing in the neighborhood where this field 106 is established rather than propagating the energy from the transmitting coil into free space.

The resonant frequency of the loop or magnetic coils is based on the inductance and capacitance. Inductance may be simply the inductance created by the coil 352, whereas, capacitance may be added to the coil's inductance to create a resonant structure at a desired resonant frequency. As a non-limiting example, capacitor 352 and capacitor 354 may be added to the transmit circuitry 350 to create a resonant circuit that selects a signal 356 at a resonant frequency. Accordingly, for larger diameter coils, the size of capacitance needed to sustain resonance may decrease as the diameter or inductance of the loop increases. Furthermore, as the diameter of the coil increases, the efficient energy transfer area of the near-field may increase. Other resonant circuits formed using other components are also possible. As another non-limiting example, a capacitor may be placed in parallel between the two terminals of the coil 350. For transmit coils, a signal 358 with a frequency that substantially corresponds to the resonant frequency of the coil 352 may be an input to the coil 352.

In one embodiment, the transmitter 104 may be configured to output a time varying magnetic field with a frequency corresponding to the resonant frequency of the transmit coil 114. When the receiver is within the field 106, the time varying magnetic field may induce a current in the receive coil 118. As described above, if the receive coil 118 is configured to resonant at the frequency of the transmit coil 118, energy may be efficiently transferred. The AC signal induced in the receive coil 118 may be rectified as described above to produce a DC signal that may be provided to charge or to power a load.

Figure 4:
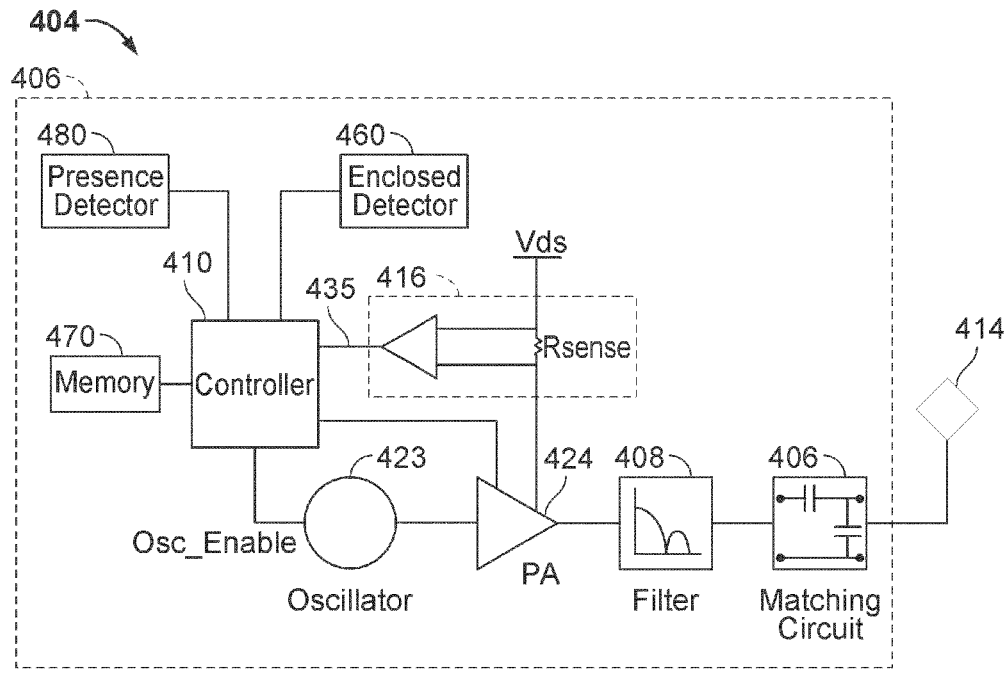
FIG. 4 is a functional block diagram of a transmitter that may be used in the wireless power transfer system of FIG. 1, in accordance with exemplary embodiments of the invention.

FIG. 4 is a functional block diagram of a transmitter 404 that may be used in the wireless power transfer system of FIG. 1, in accordance with exemplary embodiments of the invention. The transmitter 404 may include transmit circuitry 406 and a transmit coil 414. The transmit coil 414 may be the coil 352 as shown in FIG. 3. Transmit circuitry 406 may provide RF power to the transmit coil 414 by providing an oscillating signal resulting in generation of energy (e.g., magnetic flux) about the transmit coil 414. Transmitter 404 may operate at any suitable frequency. By way of example, transmitter 404 may operate at the 13.56 MHz ISM band.

Transmit circuitry 406 may include a fixed impedance matching circuit 406 for matching the impedance of the transmit circuitry 406 (e.g., 50 ohms) to the transmit coil 414 and a low pass filter (LPF) 408 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that may be varied based on measurable transmit metrics, such as output power to the coil 414 or DC current drawn by the power amplifier. Transmit circuitry 406 further includes a driver circuit 424 configured to drive an RF signal as determined by an oscillator 423. The transmit circuitry 406 may be comprised of discrete devices or circuits, or alternately, may be comprised of an integrated assembly. An exemplary RF power output from transmit coil 414 may be on the order of 2.5 Watts.

Transmit circuitry 406 may further include a controller 410 for selectively enabling the oscillator 423 during transmit phases (or duty cycles) for specific receivers, for adjusting the frequency or phase of the oscillator 423, and for adjusting the output power level for implementing a communication protocol for interacting with neighboring devices through their attached receivers. It is noted that the controller 410 may also be referred to herein as processor 410. Adjustment of oscillator phase and related circuitry in the transmission path may allow for reduction of out of band emissions, especially when transitioning from one frequency to another.

The transmit circuitry 406 may further include a load sensing circuit 416 for detecting the presence or absence of active receivers in the vicinity of the near-field generated by transmit coil 414. By way of example, a load sensing circuit 416 monitors the current flowing to the driver circuit 424, that may be affected by the presence or absence of active receivers in the vicinity of the field generated by transmit coil 414 as will be further described below. Detection of changes to the loading on the driver circuit 424 are monitored by controller 410 for use in determining whether to enable the oscillator 423 for transmitting energy and to communicate with an active receiver. As described more fully below, a current measured at the driver circuit 424 may be used to determine whether an invalid device is positioned within a wireless power transfer region of the transmitter 404.

The transmit coil 414 may be implemented with a Litz wire or as an antenna strip with the thickness, width and metal type selected to keep resistive losses low. In a one implementation, the transmit coil 414 may generally be configured for association with a larger structure such as a table, mat, lamp or other less portable configuration. Accordingly, the transmit coil 414 generally may not need "turns" in order to be of a practical dimension. An exemplary implementation of a transmit coil 414 may be "electrically small" (i.e., fraction of the wavelength) and tuned to resonate at lower usable frequencies by using capacitors to define the resonant frequency.

The transmitter 404 may gather and track information about the whereabouts and status of receiver devices that may be associated with the transmitter 404. Thus, the transmitter circuitry 404 may include a presence detector 480, an enclosed detector 460, or a combination thereof, connected to the controller 410 (also referred to as a processor herein). The controller 410 may adjust an amount of power delivered by the amplifier 424 in response to presence signals from the presence detector 480 and the enclosed detector 460. The transmitter 404 may receive power through a number of power sources, such as, for example, an AC-DC converter (not shown) to convert conventional AC power present in a building, a DC-DC converter (not shown) to convert a conventional DC power source to a voltage suitable for the transmitter 404, or directly from a conventional DC power source (not shown).

As a non-limiting example, the presence detector 480 may be a motion detector utilized to sense the initial presence of a device to be charged that is inserted into the coverage area of the transmitter. After detection, the transmitter 404 may be turned on and the RF power received by the device may be used to toggle a switch on the Rx device in a pre-determined manner, which in turn results in changes to the driving point impedance of the transmitter 404.

As another non-limiting example, the presence detector 480 may be a detector capable of detecting a human, for example, by infrared detection, motion detection, or other suitable means. In some exemplary embodiments, there may be regulations limiting the amount of power that a transmit coil 414 may transmit at a specific frequency. In some cases, these regulations are meant to protect humans from electromagnetic radiation. However, there may be environments where a transmit coil 414 is placed in areas not occupied by humans, or occupied infrequently by humans, such as, for example, garages, factory floors, shops, and the like. If these environments are free from humans, it may be permissible to increase the power output of the transmit coil 414 above the normal power restrictions regulations. In other words, the controller 410 may adjust the power output of the transmit coil 414 to a regulatory level or lower in response to human presence and adjust the power output of the transmit coil 414 to a level above the regulatory level when a human is outside a regulatory distance from the electromagnetic field of the transmit coil 414.

As a non-limiting example, the enclosed detector 460 (may also be referred to herein as an enclosed compartment detector or an enclosed space detector) may be a device such as a sense switch for determining when an enclosure is in a closed or open state. When a transmitter is in an enclosure that is in an enclosed state, a power level of the transmitter may be increased.

In exemplary embodiments, a method by which the transmitter 404 does not remain on indefinitely may be used. In this case, the transmitter 404 may be programmed to shut off after a user-determined amount of time. This feature prevents the transmitter 404, notably the driver circuit 424, from running long after the wireless devices in its perimeter are fully charged. This event may be due to the failure of the circuit to detect the signal sent from either the repeater or the receive coil that a device is fully charged. To prevent the transmitter 404 from automatically shutting down if another device is placed in its perimeter, the transmitter 404 automatic shut off feature may be activated only after a set period of lack of motion detected in its perimeter. The user may be able to determine the inactivity time interval, and change it as desired. As a non-limiting example, the time interval may be longer than that needed to fully charge a specific type of wireless device under the assumption of the device being initially fully discharged.

Figure 5:
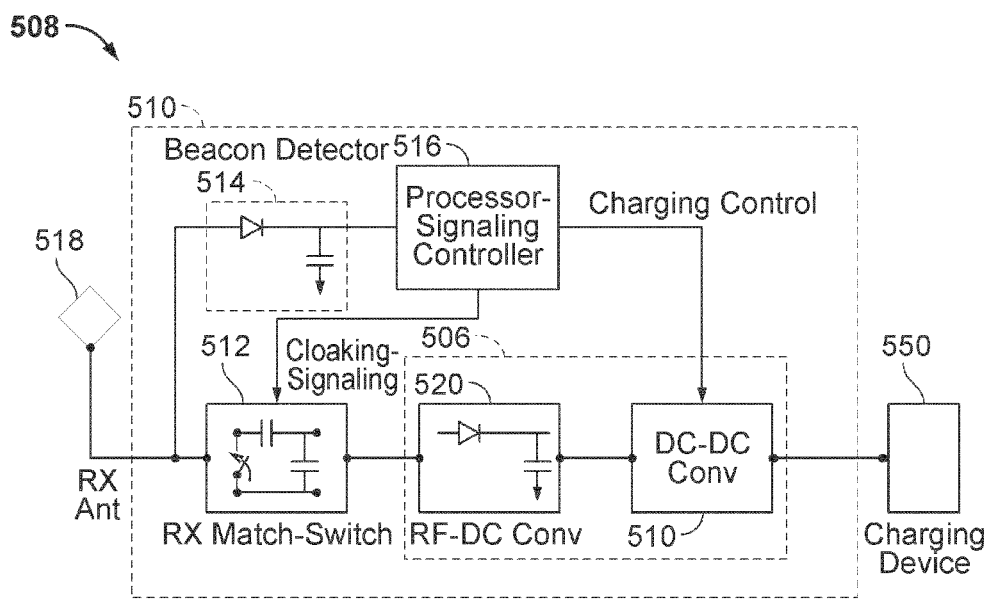
FIG. 5 is a functional block diagram of a receiver that may be used in the wireless power transfer system of FIG. 1, in accordance with exemplary embodiments of the invention.

FIG. 5 is a functional block diagram of a receiver 508 that may be used in the wireless power transfer system of FIG. 1, in accordance with exemplary embodiments of the invention. The receiver 508 includes receive circuitry 510 that may include a receive coil 518. Receiver 508 further couples to device 550 for providing received power thereto. It should be noted that receiver 508 is illustrated as being external to device 550 but may be integrated into device 550. Energy may be propagated wirelessly to receive coil 518 and then coupled through the rest of the receive circuitry 510 to device 550. By way of example, the charging device may include devices such as mobile phones, portable music players, laptop computers, tablet computers, computer peripheral devices, communication devices (e.g., Bluetooth devices), digital cameras, hearing aids (an other medical devices), and the like.

Receive coil 518 may be tuned to resonate at the same frequency, or within a specified range of frequencies, as transmit coil 414 (FIG. 4). Receive coil 518 may be similarly dimensioned with transmit coil 414 or may be differently sized based upon the dimensions of the associated device 550. By way of example, device 550 may be a portable electronic device having diametric or length dimension smaller that the diameter of length of transmit coil 414. In such an example, receive coil 518 may be implemented as a multi-turn coil in order to reduce the capacitance value of a tuning capacitor (not shown) and increase the receive coil's impedance. By way of example, receive coil 518 may be placed around the substantial circumference of device 550 in order to maximize the coil diameter and reduce the number of loop turns (i.e., windings) of the receive coil 518 and the inter-winding capacitance.

Receive circuitry 510 may provide an impedance match to the receive coil 518. Receive circuitry 510 includes power conversion circuitry 506 for converting a received RF energy source into charging power for use by the device 550. Power conversion circuitry 506 includes an RF-to-DC converter 520 and may also in include a DC-to-DC converter 510. RF-to-DC converter 508 rectifies the RF energy signal received at receive coil 518 into a non-alternating power with an output voltage represented by $V_{rect}$. The DC-to-DC converter 510 (or other power regulator) converts the rectified RF energy signal into an energy potential (e.g., voltage) that is compatible with device 550 with an output voltage and output current represented by $V_{out}$ and $I_{out}$. Various RF-to-DC converters are contemplated, including partial and full rectifiers, regulators, bridges, doublers, as well as linear and switching converters.

Receive circuitry 510 may further include switching circuitry 512 for connecting receive coil 518 to the power conversion circuitry 506 or alternatively for disconnecting the power conversion circuitry 506. Disconnecting receive coil 518 from power conversion circuitry 506 not only suspends charging of device 550, but also changes the "load" as "seen" by the transmitter 404 (FIG. 2).

As disclosed above, transmitter 404 includes load sensing circuit 416 that may detect fluctuations in the bias current provided to transmitter power amplifier circuit 410. Accordingly, transmitter 404 has a mechanism for determining when receivers are present in the transmitter's near-field.

When multiple receivers 508 are present in a transmitter's near-field, it may be desirable to time-multiplex the loading and unloading of one or more receivers to enable other receivers to more efficiently couple to the transmitter. A receiver 508 may also be cloaked in order to eliminate coupling to other nearby receivers or to reduce loading on nearby transmitters. This "unloading" of a receiver is also known herein as a "cloaking." Furthermore, this switching between unloading and loading controlled by receiver 508 and detected by transmitter 404 may provide a communication mechanism from receiver 508 to transmitter 404 as is explained more fully below. Additionally, a protocol may be associated with the switching that enables the sending of a message from receiver 508 to transmitter 404. By way of example, a switching speed may be on the order of 100 μsec.

In an exemplary embodiment, communication between the transmitter 404 and the receiver 508 refers to a device sensing and charging control mechanism, rather than conventional two-way communication (i.e., in band signaling using the coupling field). In other words, the transmitter 404 may use on/off keying of the transmitted signal to adjust whether energy is available in the near-field. The receiver may interpret these changes in energy as a message from the transmitter 404. From the receiver side, the receiver 508 may use tuning and de-tuning of the receive coil 518 to adjust how much power is being accepted from the field. In some cases, the tuning and de-tuning may be accomplished via the switching circuitry 512. The transmitter 404 may detect this difference in power used from the field and interpret these changes as a message from the receiver 508. It is noted that other forms of modulation of the transmit power and the load behavior may be utilized.

Receive circuitry 510 may further include signaling detector and beacon circuitry 514 used to identify received energy fluctuations, that may correspond to informational signaling from the transmitter to the receiver. Furthermore, signaling and beacon circuitry 514 may also be used to detect the transmission of a reduced RF signal energy (i.e., a beacon signal) and to rectify the reduced RF signal energy into a nominal power for awakening either un-powered or power-depleted circuits within receive circuitry 510 in order to configure receive circuitry 510 for wireless charging.

Receive circuitry 510 further includes processor 516 for coordinating the processes of receiver 508 described herein including the control of switching circuitry 512 described herein. Cloaking of receiver 508 may also occur upon the occurrence of other events including detection of an external wired charging source (e.g., wall/USB power) providing charging power to device 550. Processor 516, in addition to controlling the cloaking of the receiver, may also monitor beacon circuitry 514 to determine a beacon state and extract messages sent from the transmitter 404. Processor 516 may also adjust the DC-to-DC converter 510 for improved performance.

Figure 6:
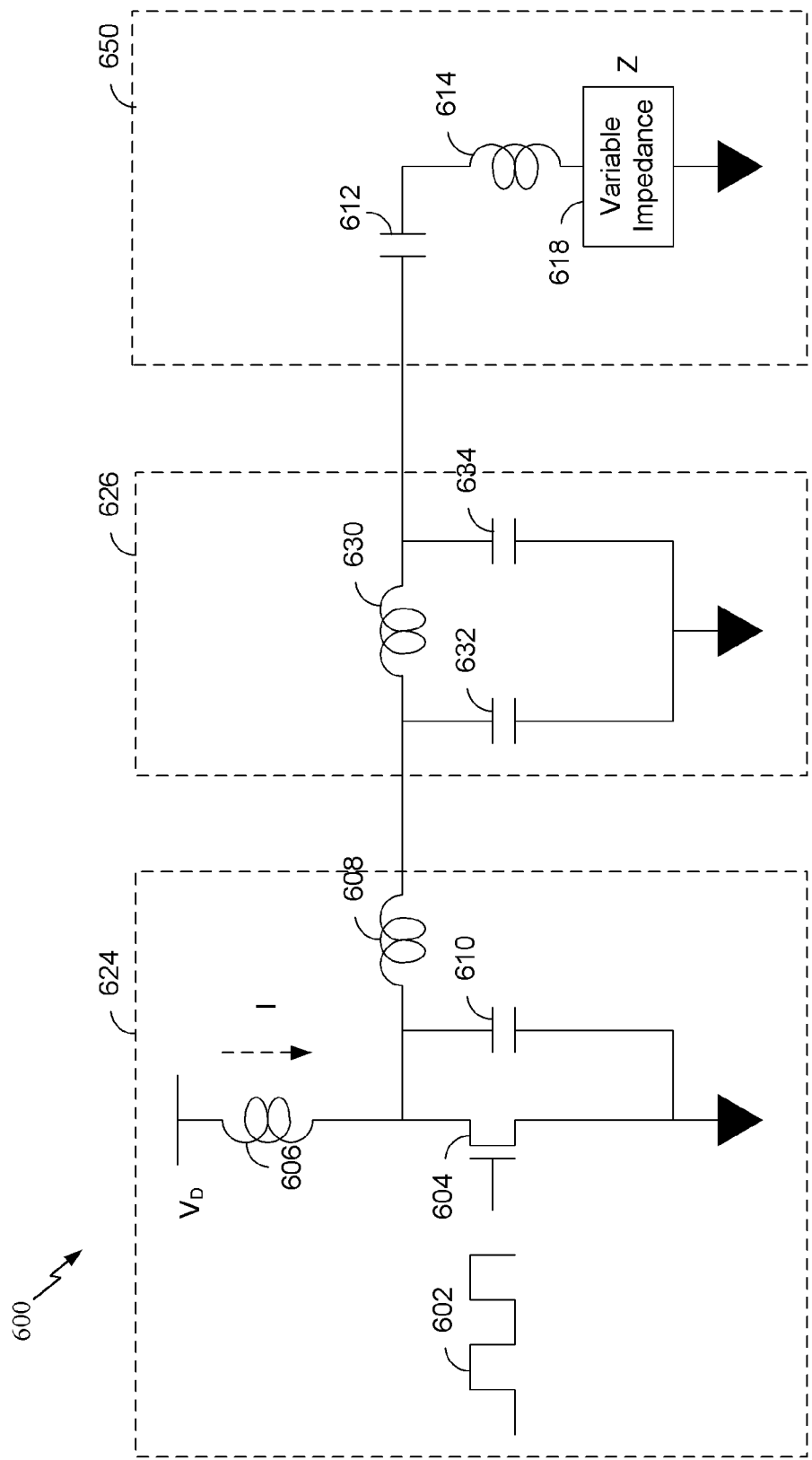
FIG. 6 is a schematic diagram of a portion of transmit circuitry that may be used in the transmit circuitry of FIG. 4.

FIG. 6 is a schematic diagram of a portion of transmit circuitry 600 that may be used in the transmit circuitry 406 of FIG. 4. The transmit circuitry 600 may include a driver circuit 624 as described above in FIG. 4. As described above, the driver circuit 624 may be a switching amplifier that may be configured to receive a square wave and output a sine wave to be provided to the transmit circuit 650. In some cases the driver circuit 624 may be referred to as an amplifier circuit. The driver circuit 624 is shown as a class E amplifier, however, any suitable driver circuit 624 may be used in accordance with embodiments of the invention. The driver circuit 624 may be driven by an input signal 602 from an oscillator 423 as shown in FIG. 4. The driver circuit 624 may also be provided with a drive voltage $V_D$ that is configured to control the maximum power that may be delivered through a transmit circuit 650. To eliminate or reduce harmonics, the transmit circuitry 600 may include a filter circuit 626. The filter circuit 626 may be a three pole (C 632, L 630, C 634) low pass filter circuit 626.

The signal output by the filter circuit 626 may be provided to a transmit circuit 650 comprising a coil 614. The transmit circuit 650 may include a series resonant circuit having a capacitance 612 and inductance (e.g., that may be due to the inductance or capacitance of the coil 614) that may resonate at a frequency of the filtered signal provided by the driver circuit 624. The load of the transmit circuit 650 may be represented by a variable impedance 618. The variable impedance 618 may include, for example, any combination of one or more variable resistors, variable capacitors, variable inductors, or other electronic elements. The load may be a function of a wireless power receiver 508 that is positioned to receive power from the transmit circuit 650.

The load presented the driver circuit 624 may have a reactance that varies due to, for example, a variable number of wireless power receivers that are positioned to receive power. The reactance of the load may vary widely for a loosely coupled wireless power transfer system 100. The efficiency of a driver circuit 624 may be sensitive to and vary due to changes in the load reactance. For example, Class E amplifiers may be sensitive to the loads placed on them, and may be damaged if the load changes excessively in either real or imaginary impedance. The switching devices may be damaged by overvoltage, over-current, or over-temperature operation.

Over-temperature operation can be caused by several issues, including a change in load. A class E amplifier may be highly efficient at one set of complex impedances. At this set of impedances, the class E amplifier exhibits zero-voltage switching behavior with a simple 50% gate drive duty cycle. The class E may turn on at zero voltage and the voltage returns to zero at the moment it shuts off. This may allow for an efficient switching operation.

Figure 7:
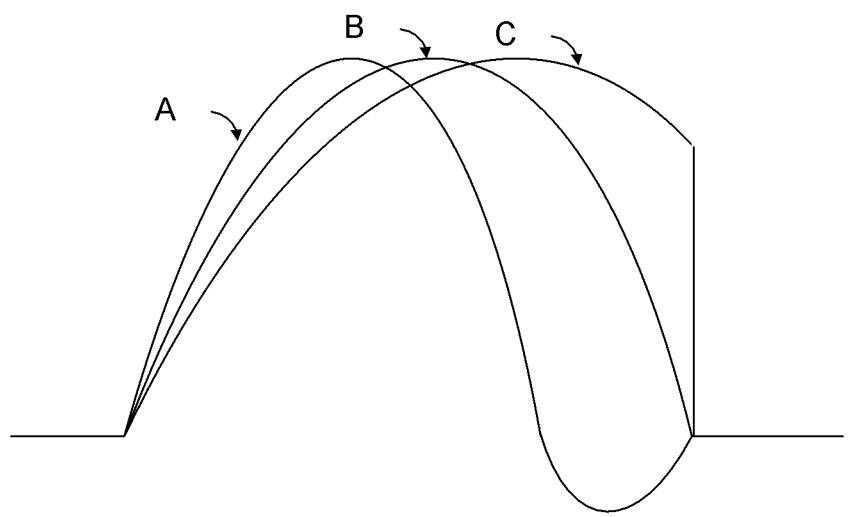
FIG. 7 shows a plot of voltage values across a device with different load characteristics.

FIG. 7 shows a plot of voltage values across a device with different load characteristics. In FIG. 7, curve B represents the voltage across the device at ideal loads (i.e., optimal switching), curve A represents an excessively capacitive load, and curve C represents an excessively inductive load. Outside this range of ideal impedances, zero voltage switching may not occur. When the load is excessively capacitive, for example, the ideal gate turn on point may occur sooner than the 50% point, and thus the device may be driven backwards into reverse conduction if a fixed gate drive is used. This results in inefficiencies since the switching devices are typically more lossy in the reverse direction. When the load is excessively inductive, the ideal gate turn on point may come after the 50% point, and thus the device may be forced to switch at a non-zero voltage. This increases switching losses.

In an embodiment, the efficiency of a class E power amplifier (PA), such as the driver circuit 624 (FIG. 6), depends primarily on the shape of the PA field effect transistor (FET) 604 drain voltage, for example, as shown in FIG. 7. When the pulse width of the drain voltage matches the duty cycle of the driver circuit 625, the PA is operating at maximum efficiency (curve B). In an embodiment, the pulse starts when the FET 604 turns off, so changing the pulse width changes the timing of the falling edge of the pulse. When the pulse is thin, efficiency drops slowly (curve A). When the pulse it is too wide it gets truncated by the FET 604 turning on, causing losses and possible damage of the FET 604 (curve C).

When taken to extremes, these additional losses can cause excessive heating and device failure. According to one embodiment, to avoid excessive heating and device failure, and to allow the class E to operate into non-ideal loads with higher efficiency, the driver circuit 624 and an impedance transformation circuit (such as the filter circuit 626) may be designed to run efficiently over a large range of resistance values at a particular reactance. The system may become inefficient, however, as the reactance shifts. As there may be a wide variety of reactance presented to the system, it may be desirable to detect a change in the load reactance in order to, for example, shift the load reactance into an acceptable range.

Figure 8:
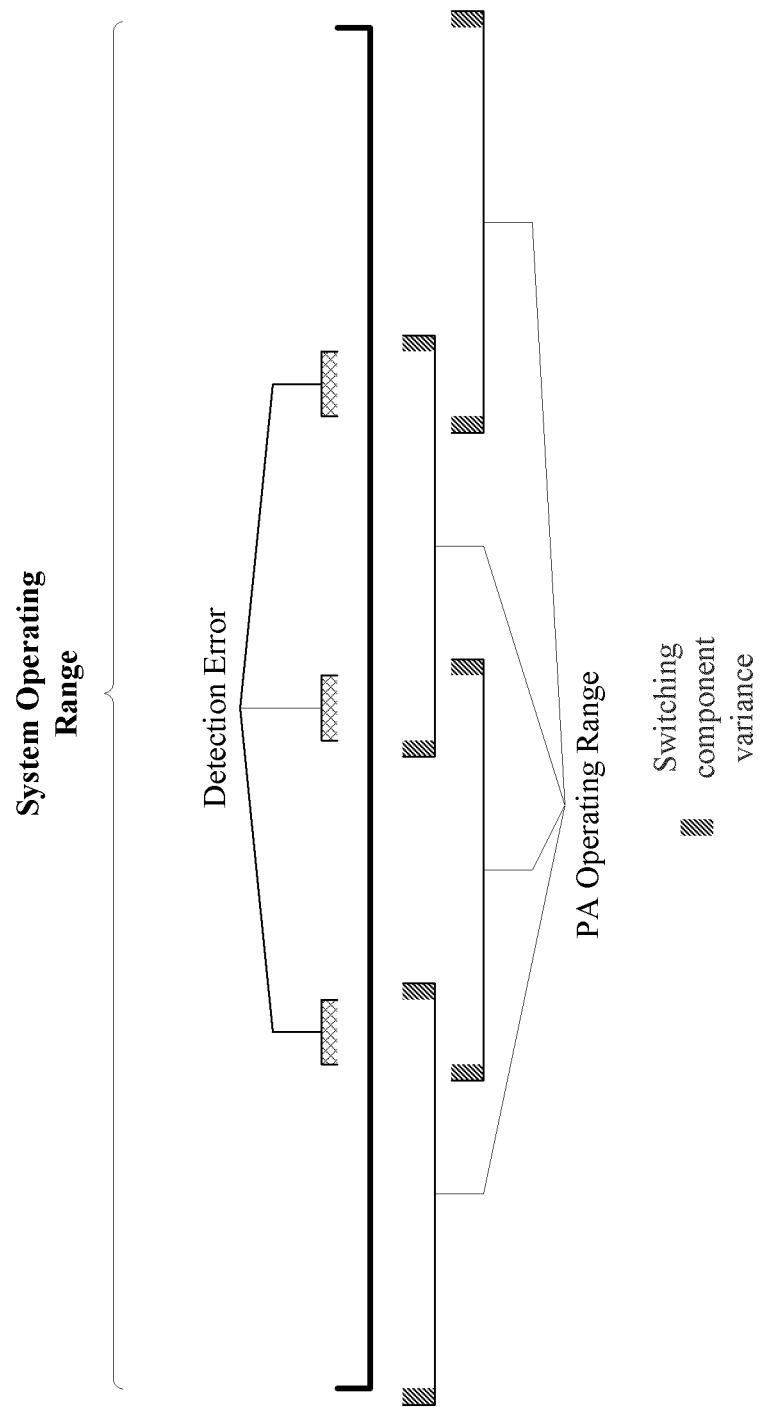
FIG. 8 is a diagram showing a wireless power transfer system operating range.

FIG. 8 is a diagram showing a wireless power transfer system 100 operating range. FIG. 8 shows the wireless power transfer system 100 operating over a range of reactance values with a driver circuit 624 efficient operating range that may be effectively shifted to cover the system operating range. As shown, the driver circuit 624 operating range (defined by the reactances for which the driver circuit 624 is adequately efficient) may be relatively small as compared to a desired system operating range. The transmitter 404 may have an impedance detection circuit that may be configured to detect an amount of reactance of the load or at least be able to determine whether the reactance falls within a particular range. To effectively increase the efficient operating range of the driver circuit 624, a switching network may be used to adjust the reactance of the load to a value that falls within the range for which the driver circuit 624 is efficient. The switching network may provide reactance shifts based on the output of the impedance detection circuit.

In an embodiment, the detection circuitry can provide a binary feedback indicative of whether the load is within an acceptable range. For example, the detection circuitry may provide an output indicative of an acceptable load when the driver circuit 624 can achieve at least a threshold efficiency given the detected load. On the other hand, the detection circuitry may provide an output indicative of an unacceptable load when the driver circuit 624 will not achieve at least a threshold efficiency given the detected load. In another embodiment, the detection circuitry may provide an output indicative of whether the load value is too inductive, too capacitive or acceptable. In another embodiment, the detection circuitry may provide a continuous spectrum of feedback, the output indicating how inductive or capacitive the load is. A continuous output may allow a switching controller to can switch directly to the correct state, rather than iterating towards it.

Figure 9:
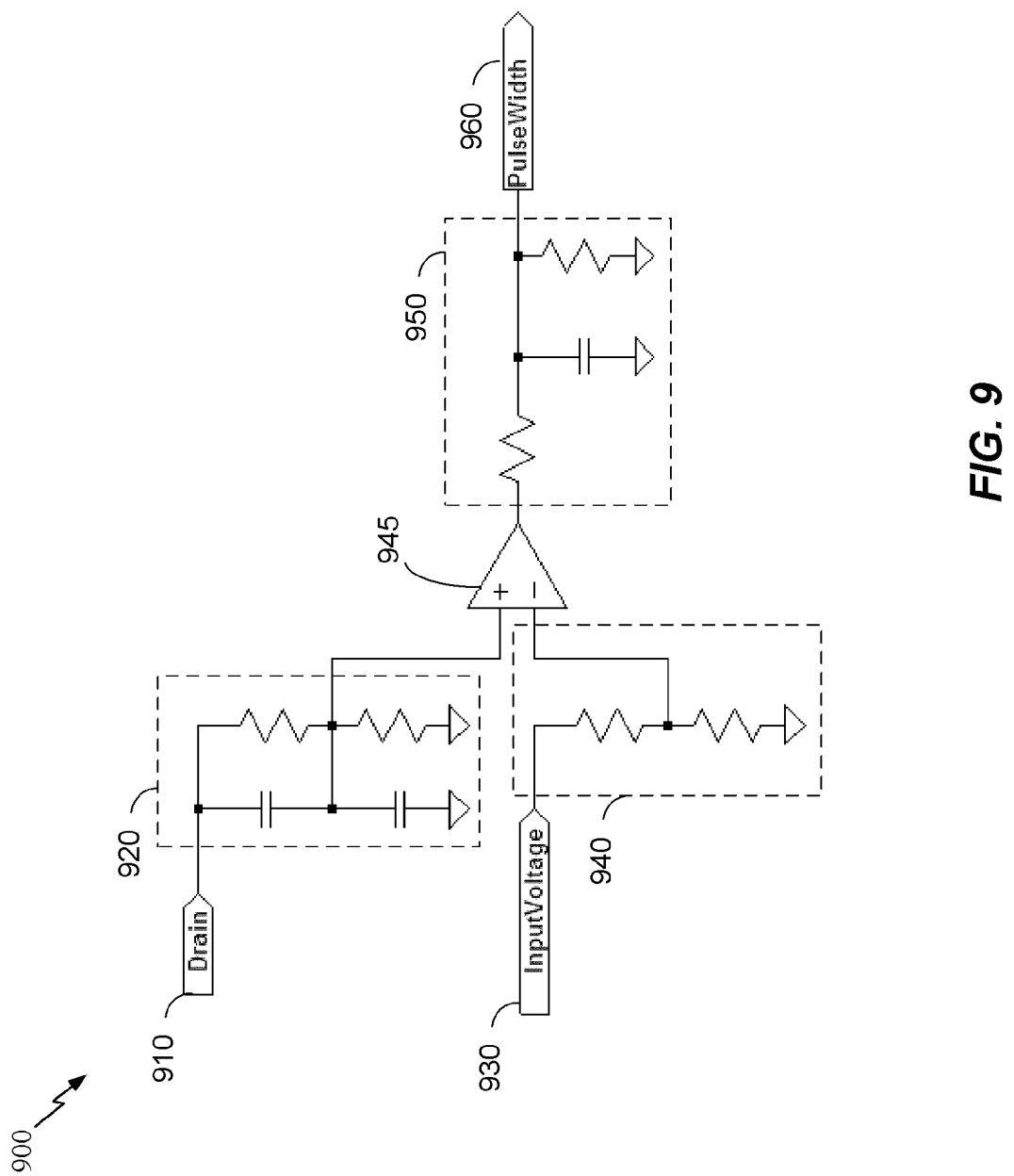
FIG. 9 is a schematic diagram of an impedance detection circuit, according to an embodiment.

FIG. 9 is a schematic diagram of an impedance detection circuit 900, according to an embodiment. As shown, the impedance detection circuit 900 includes a drain input 910, a first voltage divider 920, a threshold input 930, a second voltage divider 940, a comparator 945, an output filter 950, and an output 960. In an embodiment, when the pulse width of the voltage at the FET 604 drain (FIG. 6) is thin, it can be detected by converting the drain voltage 910 pulse into a square wave using a fast comparator 920 to compare with a threshold voltage 930, then averaging the resulting square wave with a filter 950 to get an analog value.

The drain input 910 serves to receive the voltage pulse at the drain of an amplifier. In an embodiment, the drain input 910 can receive the drain voltage from FET 604 (FIG. 6). In an embodiment, the drain input 910 can be filtered by the first voltage divider 920. The first voltage divider 920 serves to divide the voltage of the drain input 910, impedance match the input, and output the result into the comparator 945.

The threshold input 930 serves to receive a threshold voltage indicative of a pulse at the drain input 910. In various embodiments, the threshold input 930 can receive the threshold voltage from the input voltage 602 (FIG. 6), a rectified envelope of the drain voltage 910, or a fixed voltage supply. In an embodiment, the second voltage divider 940 serves to divide the voltage of the threshold input 930 and to output the divided voltage into the comparator 945.

The comparator 945 serves to measure the drain pulse width by comparing the voltage divided version of the drain input 910 with the threshold input 930. The comparator 945 can be configured to output a square wave. For example, the comparator 945 can output a high voltage signal when the positive input is at or above the negative input, and can output a low voltage signal when the positive input is below the negative input.

The output filter 950 serves to average the square wave output of the comparator 945. The resulting analog voltage can be fed into a microcontroller (not shown). Depending on the threshold input 930 voltage, the pulse width feedback may not increase monotonically. In many cases, the pulse width may go back down after the pulse width exceeds 50%. This may be due to a slower rising slope of the pulse making the threshold crossing point move while the falling slope is constrained by the FET 604 switching action. Moreover, this method may be less effective when the pulse width becomes greater than the drive duty cycle, because the pulse may become truncated as the FET 604 turns on.

Figure 10:
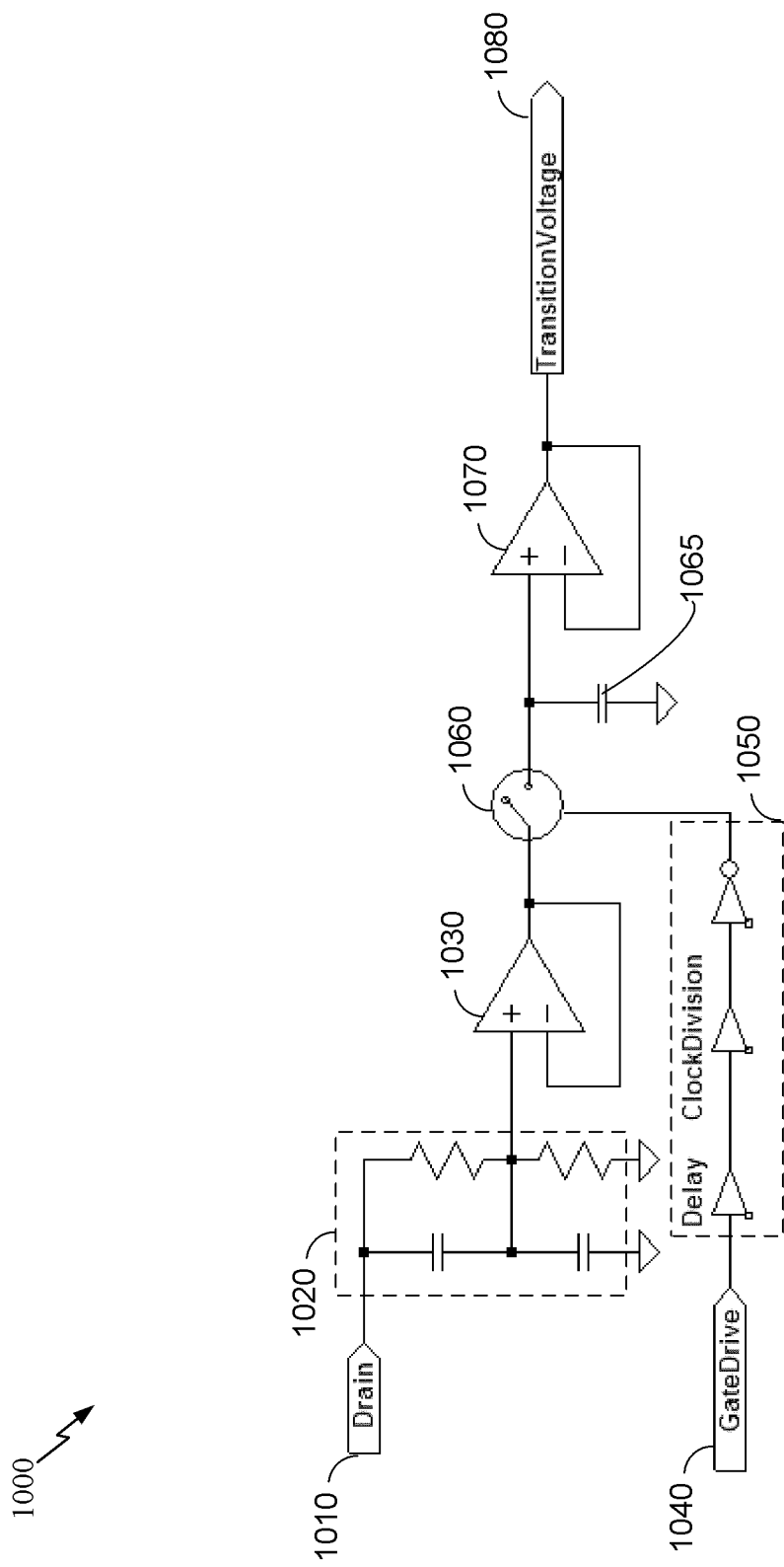
FIG. 10 is a schematic diagram of an impedance detection circuit, according to another embodiment.

FIG. 10 is a schematic diagram of an impedance detection circuit 1000, according to another embodiment. As shown, the impedance detection circuit 1000 includes a drain input 1010, a voltage divider 1020, a first operational amplifier 1030, a gate drive input 1040, a delay circuit 1050, a sampling switch 1060, a sampling capacitor 1065, a second operational amplifier 1070, and an output 1080. In the illustrated embodiment, the drain voltage at the drain input 1010 can be sampled at the moment the FET 604 turns on. In various embodiments, the drain input 1010 can be sampled at substantially the same time as the transition time of the FET 604, but it may precede or follow the transition. For example, the absolute difference between the sampling time and the transition time of the FET 604 can be less than about 10% of the oscillator 423 frequency, less than about 5% of the oscillator 423 frequency, or more particularly, less than about 1% of the oscillator 423 frequency. In various embodiments, it may not be feasible to directly measure the switching voltage without a potentially expensive high speed analog-to-digital converter (ADC). In the illustrated embodiment, the impedance detection circuit 1000 is a sample-hold circuit. The sample-hold impedance detection circuit 1000 can be synchronized with the FET drive signal 602 (FIG. 6) and can sample the drain input 1010 in a very short period of time. This sampled value can then be read by a low-speed ADC built into a microcontroller (not shown).

The drain input 1010 serves to receive the voltage pulse at the drain of an amplifier. In an embodiment, the drain input 1010 can receive the drain voltage from FET 604 (FIG. 6). In an embodiment, the drain input 1010 can be reduced by the voltage divider 1020. The voltage divider 1020 serves to divide the voltage of the drain input 1010, impedance match the input, and output the result into the first operational amplifier 1030. The first operational amplifier 1030 can serve as a voltage buffer for the divided voltage of the drain input 1010. In an embodiment, the first operational amplifier 1030 may receive the divided voltage of the drain input 1010 at a non-inverting input, and may feed back a first operational amplifier output to an inverting input.

The gate drive input 1040 serves to receive the FET drive signal 602 (FIG. 6). The delay circuit 1050 may receive the FET drive signal 603 from the gate drive input 1040 and delay the FET drive signal 603 sufficient to synchronize the FET drive signal 603 and the output of the first operational amplifier 1030 at the sampling switch 1060. In various embodiments, the delay circuit 1050 may include one or more buffers and/or inverters. The sampling switch 1060 serves to sample the output of the first operational amplifier 1030 when it receives the synchronized gate drive input 1040 from the delay circuit 1050. In an embodiment, the sampling switch 1060 can include a pass-gate.

The sampling capacitor 1065 serves to store the voltage output by the first operational amplifier 1030. When the sampling switch 1060 is closed, the sampling capacitor 1065 may receive the voltage output by the first operational amplifier 1030. When the sampling switch 1060 is open, the sampling capacitor 1065 may continue to store the voltage output by the first operational amplifier 1030 at a non-inverting input of the second operational amplifier 1070. The second operational amplifier 1070 can serve as a voltage buffer for the sampled drain input 1010. In an embodiment, the second operational amplifier 1070 may receive the divided voltage of the drain input 1010 from the sampling capacitor 1065 at a non-inverting input, and may feed back a second operational amplifier output to an inverting input. The second operational amplifier 1070 can output the sampled voltage at the output 1080.

In the illustrated embodiment, the further past the duty cycle the pulse continues, the higher the sampled voltage. One potential downside of this approach is the cost of analog sample and hold circuitry. In an embodiment, if continuous detection is not desired, the technique can be simplified by using digital sample and hold. In an embodiment where only the region of operation is determined, detection can be simplified by using a comparator and digital flip-flops to sample the state rather than an analog value.

Figure 11:
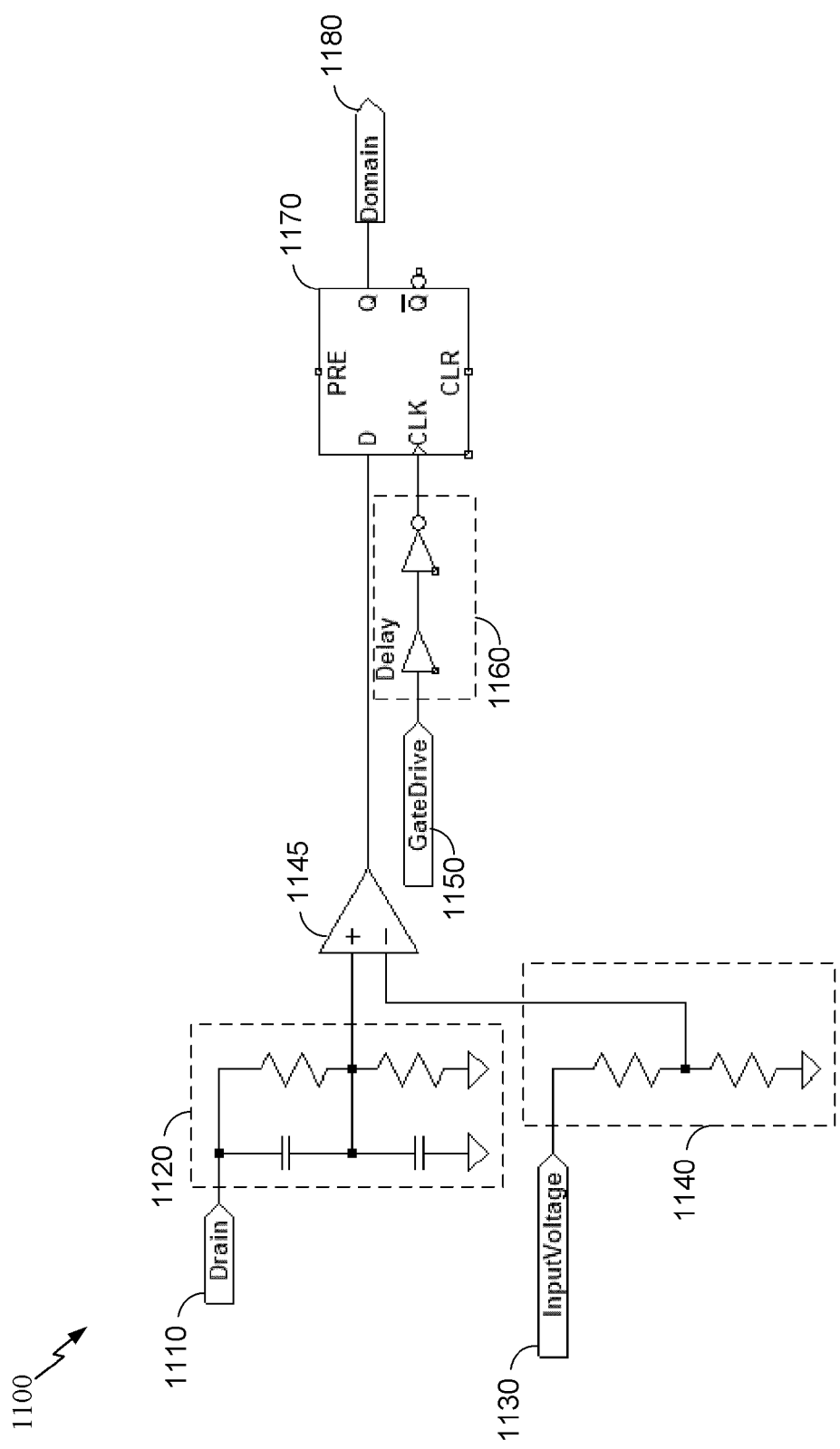
FIG. 11 is a schematic diagram of an impedance detection circuit, according to an embodiment.

FIG. 11 is a schematic diagram of an impedance detection circuit 1100, according to an embodiment. As shown, the impedance detection circuit 1100 includes a drain input 1110, a drain filter 1120, a threshold input 1130, a voltage divider 1140, a comparator 1145, a gate drive input 1150, a delay circuit 1160, a flip-flop 1170, and an output 1150. In the illustrated embodiment, the pulse width of the voltage at the FET 604 drain (FIG. 6) can be converted to digital values using the comparator 1145 as described above with respect to FIG. 9. Instead of averaging the output, the digital value can be sampled by the flip-flop 1170 clocked with a specific delay. The illustrated embodiment may handle wide pulses because the FET 604 may not be a perfect switch.

The drain input 1110 serves to receive the voltage pulse at the drain of an amplifier. In an embodiment, the drain input 1110 can receive the drain voltage from FET 604 (FIG. 6). In an embodiment, the drain input 1110 can be filtered by the drain filter 1120. The drain filter 1120 serves to divide the voltage of the drain input 1110, filter the pulse, and output the result into the comparator 1145.

The threshold input 1130 serves to receive a threshold voltage indicative of a pulse at the drain input 1110. In various embodiments, the threshold input 1130 can receive the threshold voltage from the input voltage 602 (FIG. 6), a rectified envelope of the drain voltage 1110, or a fixed voltage supply. In an embodiment, the voltage divider 1140 serves to divide the voltage of the threshold input 1130 and to output the divided voltage into the comparator 1145.

The comparator 1145 serves to measure the drain pulse width by comparing the voltage divided version of the drain input 1110 with the threshold input 1130. The comparator 1145 can be configured to output a square wave. For example, the comparator 1145 can output a high voltage signal when the positive input is at or above the negative input, and can output a low voltage signal when the positive input is below the negative input.

The gate drive input 1150 serves to receive the FET drive signal 602 (FIG. 6). The delay circuit 1160 may receive the FET drive signal 603 from the gate drive input 1150 and delay the FET drive signal 603 sufficient to synchronize the FET drive signal 603 and the output of the comparator 1145 at a data input of the flip-flop 1170. In various embodiments, the delay circuit 1160 may include one or more buffers and/or inverters. In one embodiment, the delay circuit 1160 can be omitted.

The flip-flop 1170 serves to sample the output of the comparator 1145 at the data input. In an embodiment, the flip-flop 1170 can be a d-flip-flop. The flip-flop 1170 may sample the data input at a rising or falling edge on a clock input. The clock input of the flip-flop 1170 may receive the delayed gate drive input 1150 from the delay circuit 1160. By using the envelope of the drain voltage as the reference voltage for the pulse width detector the resulting pulse width peaks then begins dropping after the clipping occurs. By sampling the digital value coming out of the comparator 1145 with some delay after the gate drive switches, the side of the pulse width curve that is being measured can be determined.

Figure 12:
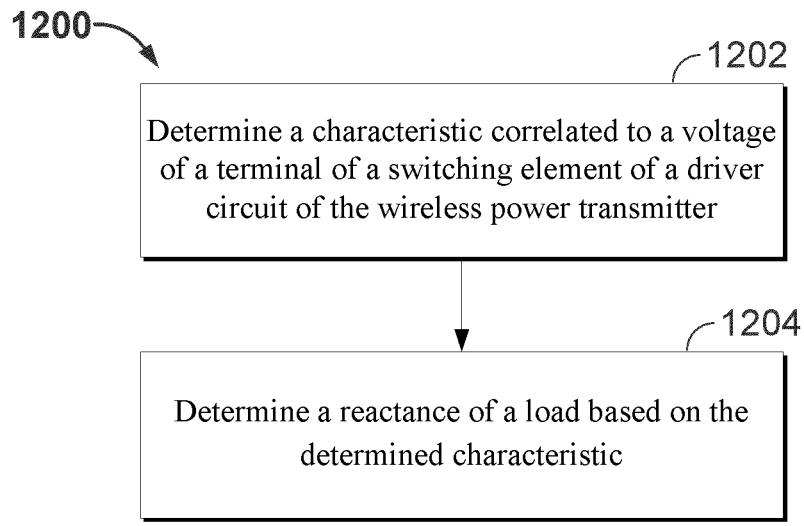
FIG. 12 is a flowchart of an exemplary method of detecting a load impedance of a wireless power transmitter.

FIG. 12 is a flowchart of an exemplary method 1200 of detecting a load impedance of a wireless power transmitter. Although the method of flowchart 1200 is described herein with reference to the circuit 1100 discussed above with respect to FIG. 11, a person having ordinary skill in the art will appreciate that the method of flowchart 1200 may be implemented by the transmitter 104 discussed above with respect to FIG. 1, the transmitter 204 discussed above with respect to FIG. 2, and/or any other suitable device. In an embodiment, the steps in flowchart 1200 may be performed by a processor or controller in conjunction with one or more of the comparator 1145, the delay circuit 1160, and the flip-flop 1170. Although the method of flowchart 1200 is described herein with reference to a particular order, in various embodiments, blocks herein may be performed in a different order, or omitted, and additional blocks may be added.

In block 1202, a detector determines a characteristic correlated to a voltage of a terminal of a switching element of a driver circuit of the wireless power transmitter. In various embodiments, the detector can include the impedance detection circuit 900, 1000, and/or 1100, described above with respect to FIGS. 9, 10, and 11 respectively.

In an embodiment, the characteristic is a digital characteristic indicating a voltage level above or below a limit, based on the reactance of the load. For example, the characteristic can be the output of the comparator 945 or 1145, described above with respect to FIGS. 9 and 11 respectively. The flip-flop 1170 can sample the digital characteristic using a flip-flop clocked after the switching element turns on. In an embodiment, the flip-flop 1170 is clocked with a delay. In various embodiments, the flip-flop 1170 can sample the digital characteristic at substantially the same time as the transition time of the switching element, but it may precede or follow the transition. For example, the absolute difference between the sampling time and the transition time of the FET 604 can be less than about 10% of the oscillator 423 frequency, less than about 5% of the oscillator 423 frequency, or more particularly, less than about 1% of the oscillator 423 frequency.

In another embodiment, the characteristic is an analog characteristic indicating the reactance of the load. For example, the characteristic can be the output of the op-amp 1030, described above with respect to FIG. 10. The switch 1060 (FIG. 10) and the capacitor 1065 can sample and hold the analog characteristic for a period of time.

In another embodiment, determining the characteristic includes comparing the voltage to a threshold voltage.

In another embodiment, the characteristic can be the voltage at the drain of the transistor 604 (FIG. 6). Determining the characteristic can include comparing the characteristic to a threshold characteristic. For example, the comparator 945 or 1145, described above with respect to FIGS. 9 and 11 respectively, can compare the drain voltage to a threshold voltage.

In various embodiments, the load can include a transmit circuit and/or resonator. In an embodiment, the terminal is a source terminal. In another embodiment, the terminal is a drain terminal.

In block 1204, a controller may determine a reactance load change based on the determined voltage. For example, a change in the characteristic over time can indicate a change in reactance load. In an embodiment, the controller may adjust an impedance of a transmit circuit based on the determined reactance load change.

Figure 13:
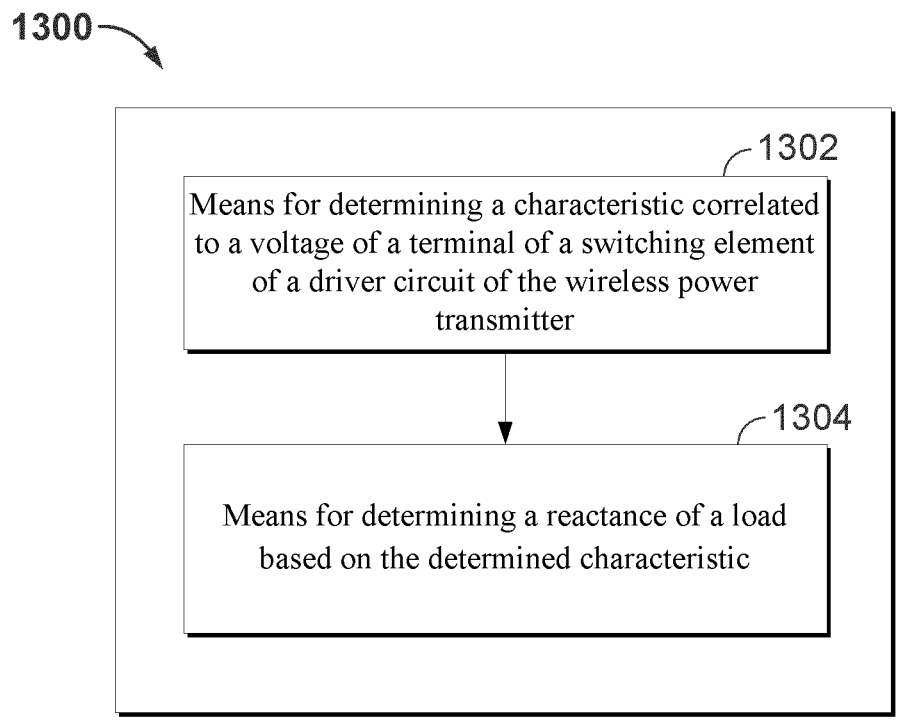
FIG. 13 is a functional block diagram of a load impedance detector in accordance with an exemplary embodiment of the invention.

FIG. 13 is a functional block diagram of a load impedance detector 1300, in accordance with an exemplary embodiment of the invention. The load impedance detector 1300 includes means 1302 for determining a characteristic correlated to a voltage of a terminal of a switching element of a driver circuit of the wireless power transmitter. In an embodiment, means 1302 for determining a characteristic correlated to a voltage of a terminal of a switching element of a driver circuit of the wireless power transmitter may be configured to perform one or more of the functions discussed above with respect to the block 1202. The load impedance detector 1300 further includes means 1304 for determining a reactance of a load based on the determined characteristic. In an embodiment, means 1304 for determining a reactance of a load based on the determined characteristic may be configured to perform one or more of the functions discussed above with respect to the block 1204.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations. Means for driving may be provided including driver circuits such as a switching amplifier. The means for driving may be a class E amplifier. Means for adjusting impedance may include an impedance adjustment circuit comprising one or more reactive elements that may be selectively switched into the circuit. Means for switching may be provided including electric switches such as solid state switches, reed relays, armature type relays, and the like. Means for wirelessly transmitter power may include the wireless power transmitter as described above.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of operating a wireless power transmitter, the method comprising:
   determining a characteristic correlated to a voltage of a terminal of a switching element of a driver circuit of the wireless power transmitter; and
   determining a reactance of a load based on the determined characteristic.

2. The method of claim 1, further comprising adjusting an impedance of the load based on the determined reactance of the load.

3. The method of claim 1, wherein determining the characteristic comprises sampling the characteristic at substantially the same time as a switching element transition.

4. The method of claim 1, wherein determining the characteristic comprises comparing the voltage to a threshold voltage.

5. The method of claim 1, wherein determining the characteristic comprises comparing the characteristic to a threshold characteristic.

6. The method of claim 5, wherein the threshold characteristic comprises a rectified voltage envelope.

7. The method of claim 5, wherein the threshold characteristic is proportional to an input voltage.

8. The method of claim 5, further comprising averaging a comparator output signal indicative of whether the characteristic exceeds a threshold.

9. The method of claim 1, wherein the characteristic comprises a digital characteristic indicating a voltage level above or below a limit, based on the reactance of the load.

10. The method of claim 9, further comprising sampling the digital characteristic using a flip-flop clocked at substantially the same time as a switching element transition.

11. The method of claim 1, wherein the characteristic comprises an analog characteristic indicating the reactance of the load.

12. The method of claim 11, further comprising sampling and holding the analog characteristic for a period of time.

13. The method of claim 1, wherein the load comprises a transmit circuit and/or resonator.

14. The method of claim 1, wherein the terminal comprises a source terminal.

15. The method of claim 1, wherein the terminal comprises a drain terminal.

16. An apparatus configured to determine a reactive condition of a wireless power transmitter, the apparatus comprising:
a first circuit configured to determine a characteristic correlated to a voltage of a terminal of a switching element of a driver circuit of the wireless power transmitter; and
a second circuit configured to determine a reactance of a load based on the determined characteristic.

17. The apparatus of claim 16, further comprising a circuit configured to adjust an impedance of the load based on the determined reactance of the load.

18. The apparatus of claim 16, wherein the first circuit comprises a sample-and-hold circuit configured to sample the characteristic at substantially the same time as a switching element transition.

19. The apparatus of claim 16, wherein the first circuit comprises a comparator configured to compare the voltage to a threshold voltage.

20. The apparatus of claim 16, wherein the first circuit comprises a comparator configured to compare the characteristic to a threshold characteristic.

21. The apparatus of claim 20, wherein the threshold characteristic comprises a rectified voltage envelope.

22. The apparatus of claim 20, wherein the threshold characteristic is proportional to an input voltage.

23. The apparatus of claim 19, further comprising a circuit configured to average a comparator output signal indicative of whether the characteristic exceeds a threshold.

24. The apparatus of claim 16, wherein the characteristic comprises a digital characteristic indicating a voltage level above or below a limit, based on the reactance of the load.

25. The apparatus of claim 24, further comprising a flip-flop configured to sample the digital characteristic using a flip-flop clocked at substantially the same time as a switching element transition.

26. The apparatus of claim 16, wherein the characteristic comprises an analog characteristic indicating the reactance of the load.

27. The apparatus of claim 26, further comprising a sample-and-hold circuit configured to sample the analog characteristic for a period of time.

28. The apparatus of claim 16, wherein the load comprises a transmit circuit and/or resonator.

29. The apparatus of claim 16, wherein the terminal comprises a source terminal.

30. The apparatus of claim 16, wherein the terminal comprises a drain terminal.

31. The apparatus of claim 16, wherein the first circuit comprises:
a drain voltage input;
a threshold voltage input;
a gate drive voltage input;
an output;
a comparator configured to compare the drain voltage input and the threshold voltage input, and to output a digital signal indicative of whether the drain voltage input is greater than the threshold voltage input; and
a flip-flop configured to receive the digital signal at a data input, to receive the gate drive voltage input at a clock input, to sample the digital signal on a rising or falling edge of the synchronized gate drive signal, and to output an inverted or non-inverted version of the sampled voltage at the output.

32. The apparatus of claim 31, wherein the first circuit further comprises a filter circuit configured to voltage divide and/or filter the drain voltage input.

33. The apparatus of claim 31, wherein the first circuit further comprises a voltage divider configured to voltage divide the threshold voltage.

34. The apparatus of claim 31, wherein the first circuit further comprises a delay circuit configured to receive the gate drive voltage input, to delay the gate drive voltage input, and to output a synchronized gate drive signal, and wherein the flip-flop is configured to receive synchronized gate drive signal at the clock input.

35. An apparatus for operating a wireless power transmitter, comprising:
means for determining a characteristic correlated to a voltage of a terminal of a switching element of a driver circuit of the wireless power transmitter; and
means for determining a reactance of a load based on the determined characteristic.

36. The apparatus of claim 35, further comprising means for adjusting an impedance of the load based on the determined reactance of the load.

37. The apparatus of claim 35, wherein the means for determining the characteristic comprises means for sampling the characteristic at substantially the same time as a switching element transition.

38. The apparatus of claim 35, wherein the means for determining the characteristic comprises means for comparing the voltage to a threshold voltage.

39. The apparatus of claim 35, wherein the means for determining the characteristic comprises means for comparing the characteristic to a threshold characteristic.

40. The apparatus of claim 39, wherein the threshold characteristic comprises a rectified voltage envelope.

41. The apparatus of claim 39, wherein the threshold characteristic is proportional to an input voltage.

42. The apparatus of claim 39, further comprising means for averaging a comparing means output signal indicative of whether the characteristic exceeds a threshold.

43. The apparatus of claim 35, wherein the characteristic comprises a digital characteristic indicating a voltage level above or below a limit, based on the reactance of the load.

44. The apparatus of claim 43, further comprising means for sampling the digital characteristic using a flip-flop clocked at substantially the same time as a switching element transition.

45. The apparatus of claim 35, wherein the characteristic comprises an analog characteristic indicating the reactance of the load.

46. The apparatus of claim 45, further comprising means for sampling and holding the analog characteristic for a period of time.

47. The apparatus of claim 35, wherein the load comprises a transmit circuit and/or resonator.

48. The apparatus of claim 35, wherein the terminal comprises a source terminal.

49. The apparatus of claim 35, wherein the terminal comprises a drain terminal.

50. A non-transitory computer-readable medium comprising code that, when executed, causes an apparatus to:
determine a characteristic correlated to a voltage of a terminal of a switching element of a driver circuit of a wireless power transmitter; and
determine a reactance of a load based on the determined characteristic.

51. The medium of claim 50, further comprising code that, when executed, causes the apparatus to adjust an impedance of the load based on the determined reactance of the load.

52. The medium of claim 50, further comprising code that, when executed, causes the apparatus to sample the characteristic at substantially the same time as a switching element transition.

53. The medium of claim 50, further comprising code that, when executed, causes the apparatus to compare the voltage to a threshold voltage.

54. The medium of claim 50, further comprising code that, when executed, causes the apparatus to compare the characteristic to a threshold characteristic.

55. The medium of claim 54, wherein the threshold characteristic comprises a rectified voltage envelope.

56. The medium of claim 54, wherein the threshold characteristic is proportional to an input voltage.

57. The medium of claim 54, further comprising code that, when executed, causes the apparatus to average a comparator output signal indicative of whether the characteristic exceeds a threshold.

58. The medium of claim 50, wherein the characteristic comprises a digital characteristic indicating a voltage level above or below a limit, based on the reactance of the load.

59. The medium of claim 58, further comprising code that, when executed, causes the apparatus to sample the digital characteristic using a flip-flop clocked at substantially the same time as a switching element transition.

60. The medium of claim 50, wherein the characteristic comprises an analog characteristic indicating the reactance of the load.

61. The medium of claim 60, further comprising code that, when executed, causes the apparatus to sample and hold the analog characteristic for a period of time.

62. The medium of claim 50, wherein the load comprises a transmit circuit and/or resonator.

63. The medium of claim 50, wherein the terminal comprises a source terminal.

64. The medium of claim 50, wherein the terminal comprises a drain terminal.

* * * * *